(12) United States Patent
Kim

(10) Patent No.: US 7,180,198 B2
(45) Date of Patent: Feb. 20, 2007

(54) METHOD OF FABRICATING POLYCRYSTALLINE SILICON AND SWITCHING DEVICE USING POLYCRYSTALLINE SILICON

(75) Inventor: Young-Joo Kim, Daegu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 119 days.

(21) Appl. No.: 10/848,048

(22) Filed: May 19, 2004

(65) Prior Publication Data

US 2004/0235279 A1 Nov. 25, 2004

(30) Foreign Application Priority Data

May 20, 2003 (KR) .................. 10-2003-0031810

(51) Int. Cl.
H01L 23/54 (2006.01)
(52) U.S. Cl. .............................. 257/797; 257/2; 257/59
(58) Field of Classification Search ................ 257/797, 257/1, 2, 49, 59, 75, 79, 82, 88, 918
See application file for complete search history.

(56) References Cited

U.S. PATENT DOCUMENTS

| | | | |
|---|---|---|---|
| 5,696,003 A | 12/1997 | Makita et al. ............... 438/166 |
| 5,940,690 A | 8/1999 | Kusumoto et al. | |
| 6,322,625 B2 | 11/2001 | Im ............................ 117/43 |
| 6,368,945 B1 | 4/2002 | Im ............................ 438/487 |
| 6,545,730 B1* | 4/2003 | Hwang ........................ 349/43 |
| 6,803,975 B2* | 10/2004 | Kim et al. .................... 349/43 |
| 6,833,883 B2* | 12/2004 | Park et al. .................... 349/43 |
| 2003/0020851 A1 | 1/2003 | Kim et al. | |
| 2003/0068836 A1 | 4/2003 | Hongo et al. | |
| 2003/0199176 A1 | 10/2003 | Adachi et al. | |
| 2004/0011772 A1 | 1/2004 | Okumura | |
| 2004/0072411 A1 | 4/2004 | Azami et al. | |

FOREIGN PATENT DOCUMENTS

| | | |
|---|---|---|
| EP | 1 122 561 A1 | 8/2001 |
| JP | 2000-349290 A | 12/2000 |
| JP | 2001-083521 A | 3/2001 |
| WO | WO 03/023878 A1 | 3/2003 |

OTHER PUBLICATIONS

Robert S. Sposilli et al.; Material Research Society; vol. 452, 1997; pp. 956-957.

* cited by examiner

*Primary Examiner*—David Nhu
(74) *Attorney, Agent, or Firm*—Birch, Stewart, Kolasch & Birch, LLP

(57) ABSTRACT

A method of fabricating polycrystalline silicon includes: forming a semiconductor layer of amorphous silicon on a substrate having a first region and a second region surrounding the first region; forming a plurality of flat align keys in the second region using a first mask; forming a plurality of convex align keys by etching the semiconductor layer in the first region, the plurality of convex align keys having steps against the substrate; and crystallizing the semiconductor layer in the first region by aligning a second mask with respect to the plurality of convex align keys.

25 Claims, 17 Drawing Sheets

METHOD OF FABRICATING POLYCRYSTALLINE SILICON AND SWITCHING DEVICE USING POLYCRYSTALLINE SILICON

This application claims the benefit of Korean Patent Application No. 2003-0031810, filed on May 20, 2003 in Korea, which is hereby incorporated by reference for all purposes as if fully set forth herein.

BACKGROUND OF THE INVENTION

1. Field of the Invention

The present invention relates to a method of crystallizing amorphous silicon, and more particularly, to a method of fabricating polycrystalline silicon using an align key and a switching device using the polycrystalline silicon.

2. Discussion of the Related Art

Flat panel display (FPD) devices having portability and low power consumption have been subject of recent researches in the coming of the information age. Among the various types of FPD devices, liquid crystal display (LCD) devices are widely used as monitors for notebook computers and desktop computers because of their high resolution, display ability of colors and superiority in displaying moving images.

In general, an LCD device includes two substrates disposed such that respective electrodes of the two substrates face each other. A liquid crystal layer is interposed between the respective electrodes. When a voltage is applied to the two electrodes, an electric field is generated. The electric field modulates the light transmittance of the liquid crystal layer by reorienting the liquid crystal molecules, thereby displaying images in the LCD device.

Active matrix-type display devices in which a plurality of pixel regions are disposed in matrix and a switching element, such as a thin film transistor (TFT), is formed at each pixel region, are commonly being used because of their superior display of moving images. Recently, LCD devices including TFTs using polycrystalline silicon (p-Si) have been widely researched and developed. In the LCD device using polycrystalline silicon, both a TFT of display region and a driving circuit may be formed on one substrate. Moreover, since an additional process of connecting the TFT of display region and the driving circuit is not necessary, the total fabrication process for the LCD device is simplified. Since a field effect mobility of polycrystalline silicon is several-hundreds times as great as that of amorphous silicon, the LCD device using polycrystalline silicon has a short response time and high stability against heat and light.

Amorphous silicon may be crystallized into polycrystalline silicon. A laser annealing method, where a laser beam is irradiated onto an amorphous silicon film, is widely used as a crystallization method. However, since a surface temperature of the irradiated amorphous silicon film reaches about 1400° C., the silicon film is apt to be oxidized at its top surface. Particularly, since the laser beam is irradiated several times in the laser annealing method, silicon oxide ($SiO_2$) may be created on the top surface of the silicon film when the irradiation of the laser beam is performed under ambient air. Accordingly, the laser beam may be irradiated under the vacuum of about $10^{-7}$ to $10^{-6}$ torr. To solve the problems of the laser annealing method, a sequential lateral solidification (SLS) method using a laser beam has been suggested and researched.

An SLS method utilize a fact that the grains of a silicon film grow along a direction perpendicular to a border surface of a liquid phase region and a solid phase region of the silicon film. In an SLS method, grains grow along one lateral direction by adjusting an energy density and an irradiation range of a laser beam and moving a laser beam (Robert S. Sposilli, M. A. Crowder, and James S. Im, Material Research Society Symp. Proc. Vol. 452, pages 956~957, 1997).

FIG. 1A is a schematic plane view of a mask used in a sequential lateral solidification method according to the related art and FIG. 1B is a schematic plane view of a semiconductor layer crystallized using the mask of FIG. 1A.

In FIG. 1A, since a mask 10 for an SLS method includes a slit pattern 12 having a width of several micrometers, a laser beam having a width of several micrometers may be irradiated onto a semiconductor layer. Even though not shown in FIG. 1A, a gap between adjacent slit patterns 12 may be several micrometers. For example, the slit pattern 12 may have a width of about 2 μm to about 3 μm.

In FIG. 1B, a laser beam (not shown) is irradiated onto a semiconductor layer 20 of amorphous silicon through the slit pattern 12 of the mask 10 in FIG. 1A. A region 22 of the semiconductor layer 20 irradiated by the laser beam is completely melted and grains 24a and 24b grow while the melted silicon is solidified. The grains 24a and 24b laterally grow from both ends of the irradiated region 22 and stop growing at a central portion of the irradiated region 22 to form a grain boundary 28b where the grains 24a and 24b meet. Even though not shown in FIGS. 1A and 1B, the mask 10 has a plurality of slit patterns 12 and a crystallized portion corresponding to the mask 10 may be referred to as a unit crystallization area. The semiconductor layer 20 of amorphous silicon may be fully crystallized by repeating the irradiation of the laser beam onto different regions of the semiconductor layer 20 including the irradiated region 22.

FIG. 2 is a schematic plane view of a semiconductor layer crystallized by a sequential lateral solidification method according to the related art. In FIG. 2, a semiconductor layer of polycrystalline silicon includes a plurality of unit crystallization areas 30. First and second overlapping areas 40 and 50 where a laser beam is repeatedly irradiated are created between the adjacent unit crystallization areas 30. The first overlapping area 40 is disposed along a vertical direction between two adjacent unit crystallization areas 30 and the second overlapping area 50 is disposed along a horizontal direction between two adjacent unit crystallization areas 30. Since the laser beam is irradiated onto the first and second overlapping areas 40 and 50 several times, the first and second overlapping areas 40 and 50 have non-uniform crystallization. These non-uniformly crystallized portions cause a reduction in the display quality of an LCD device, especially when the non-uniform portions are used to form a TFT of a display region in an LCD device.

SUMMARY OF THE INVENTION

The present invention is directed to a method of fabricating polycrystalline silicon and a switching device using the fabricated polycrystalline silicon, which substantially obviate one or more of problems due to limitations and disadvantages of the background art.

An object of the present invention is to provide a method of fabricating polycrystalline silicon, and a switching device using the fabricated polycrystalline silicon, wherein the formation of non-uniformly portions in a semiconductor layer is reduced or eliminated and the fabrication time is shortened.

Another object of the present invention is to provide a crystallization method where a selected portion of a layer is crystallized using a mask and an align key.

Another object of the present invention is to provide a crystallization method and a photolithographic method using an align key for both the crystallization method and the photolithographic method, and to provide a method of forming the align key.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a method of fabricating polycrystalline silicon, comprising: forming a semiconductor layer of amorphous silicon on a substrate having a first region and a second region surrounding the first region; forming a plurality of flat align keys in the second region using a first mask; forming a plurality of convex align keys from the plurality of flat align keys; and crystallizing the semiconductor layer in the first region using a second mask and using the plurality of convex align keys.

According to an aspect of the present invention, there is provided a method of fabricating an align key usable in a crystallization process of amorphous silicon, comprising: forming a semiconductor layer of amorphous silicon on a substrate; crystallizing corner portions of the semiconductor layer to form a plurality of flat align keys; and dipping the corner portions of the semiconductor layer into a secco etchant having an etch selectivity of polycrystalline silicon to amorphous silicon to form a plurality of convex align keys having steps against the substrate.

According to an aspect of the present invention, there is provided a method for fabricating a switching element, comprising: forming a semiconductor layer of amorphous silicon on a substrate having a first region and a second region surrounding the first region; forming a plurality of flat align keys in the second region using a first mask; forming a plurality of convex align keys from the plurality of flat align keys, the plurality of convex align keys having steps against the substrate; crystallizing the semiconductor layer in the first region by aligning a second mask with respect to the plurality of convex align keys; and selectively removing the semiconductor layer to form an active layer including a channel region and source and drain regions at sides of the channel region.

According to an aspect of the present invention, there is provided a switching device comprising: a substrate including a first region and a second region surrounding the first region; a plurality of convex align keys of polycrystalline silicon on the substrate in the second region, the plurality of convex align keys having steps against the substrate; an active layer of polycrystalline silicon on the substrate in the first region, the active layer including a channel region and source and drain regions at sides of the channel region; a gate insulating layer on the active layer; a gate electrode on the gate insulating layer; an interlayer insulating layer on the gate electrode, the interlayer insulating layer including a first contact hole exposing the source region and a second contact hole exposing the drain region; and source and drain electrodes on the interlayer insulating layer, the source electrode being connected to the source region through the first contact hole and the drain electrode being connected to the drain region through the second contact hole.

According to an aspect of the present invention, there is provided a display device structure comprising: a substrate having a display region and a periphery region; a plurality of align keys at corners in the periphery region; a plurality of pixel regions in the display region; and a plurality of switching element regions each in one of the pixel regions.

According to an aspect of the present invention, there is provided a method of fabricating polycrystalline silicon comprising: forming a semiconductor layer having a first portions and second portions with an amorphous silicon on a substrate having a first region and a second region adjacent the first region; forming a plurality of flat align keys in the first portions of the semiconductor in the first region of the substrate using a first mask; forming a plurality of align key patterns in the first portions of the semiconductor; and aligning the plurality of align key patterns and crystallizing the first portions of the semiconductor in the second region of the substrate using a second mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, which are illustrated in the accompanying drawings. Wherever possible, similar reference numbers will be used throughout the drawings to refer to the same or like parts.

Figure 1A:
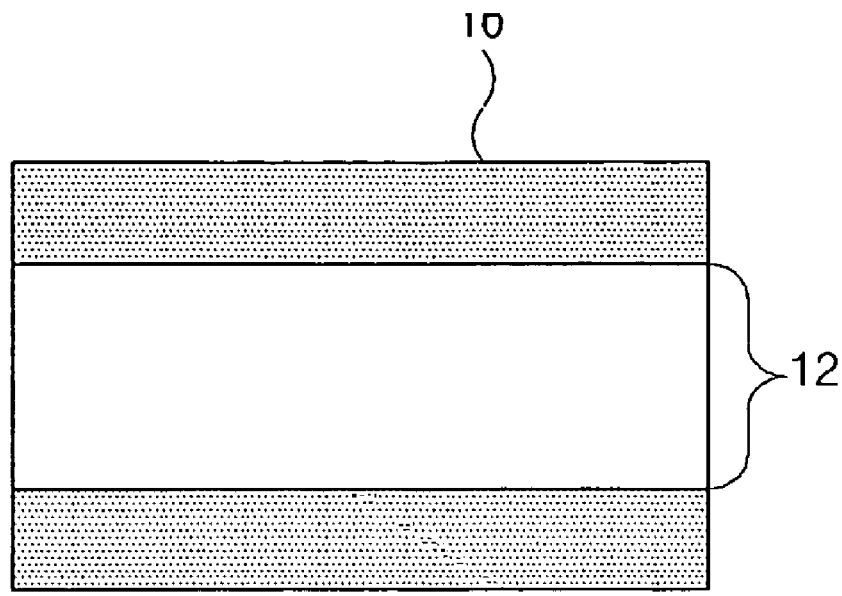
FIG. 1A is a schematic plane view of a mask used in a sequential lateral solidification method according to the related art.
Figure 1B:
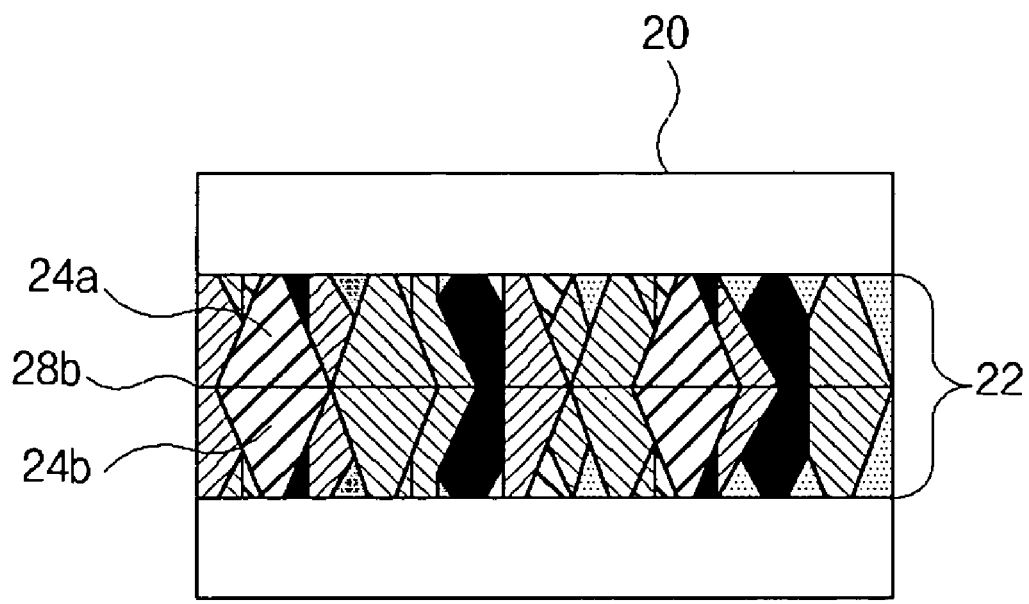
FIG. 1B is a schematic plane view of a semiconductor layer crystallized using the mask of FIG. 1A.
Figure 2:
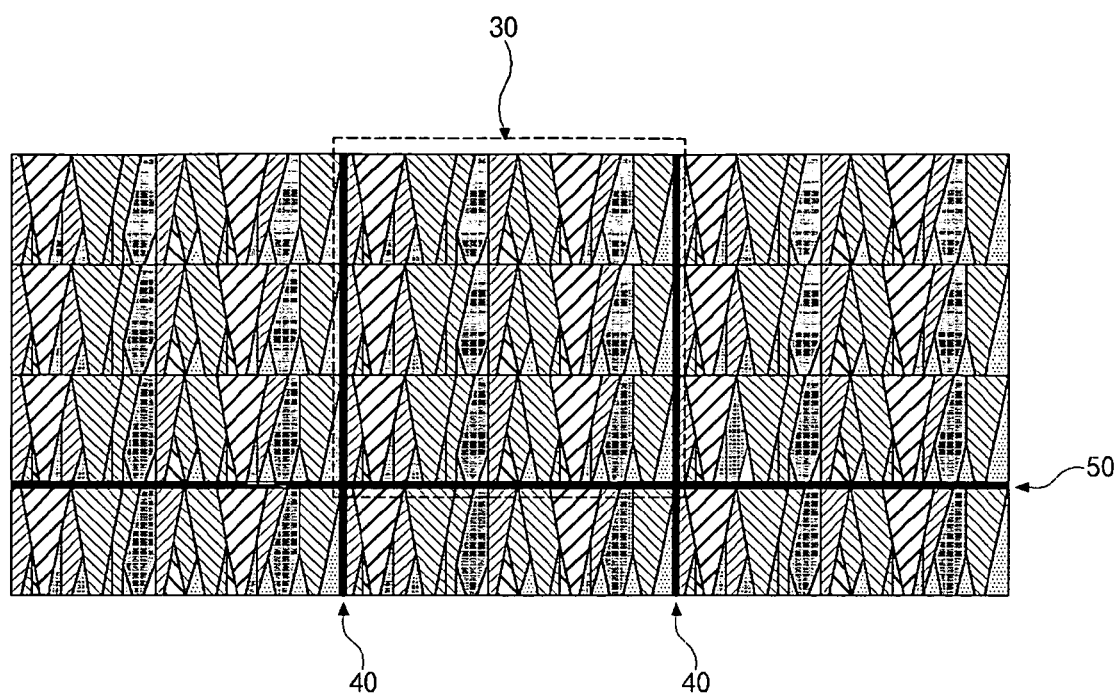
FIG. 2 is a schematic plane view of a semiconductor layer crystallized by a sequential lateral solidification method according to the related art.
Figure 3:
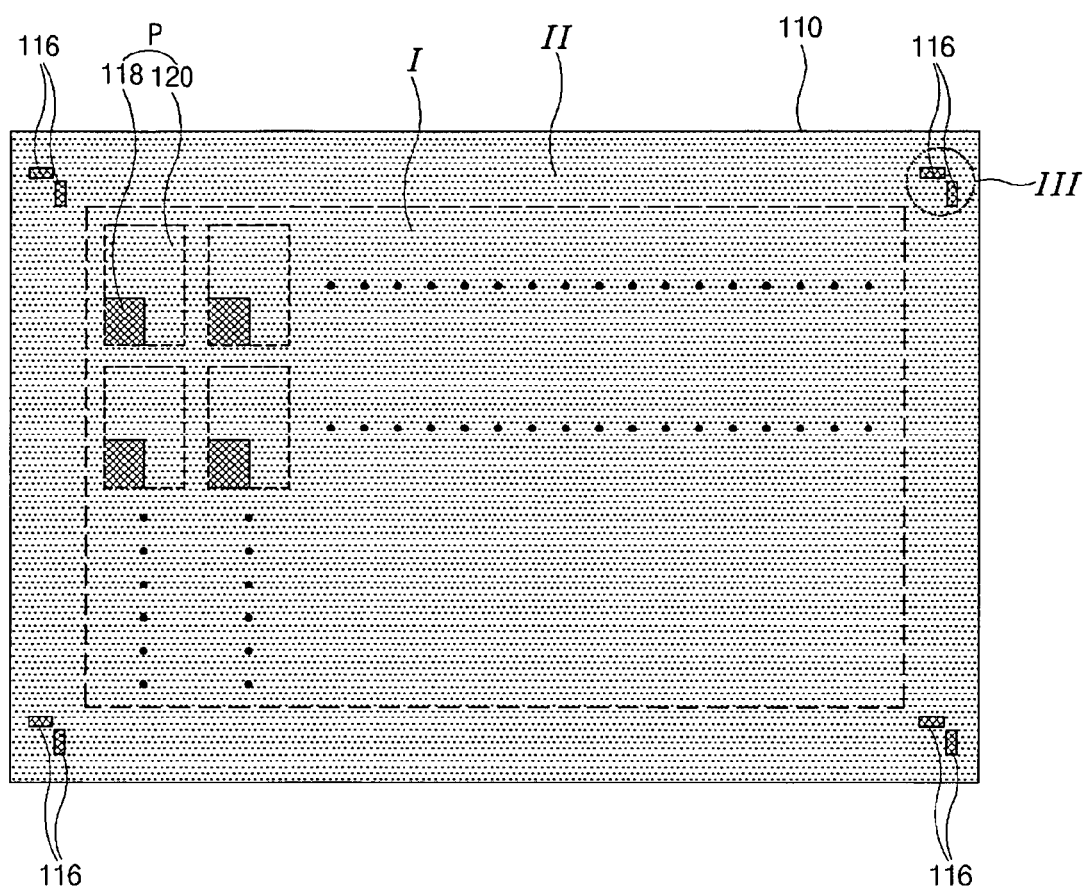
FIG. 3 is a schematic plane view of a substrate used in a method of fabricating a semiconductor layer of polycrystalline silicon according to a first embodiment of the present invention.
Figure 4:
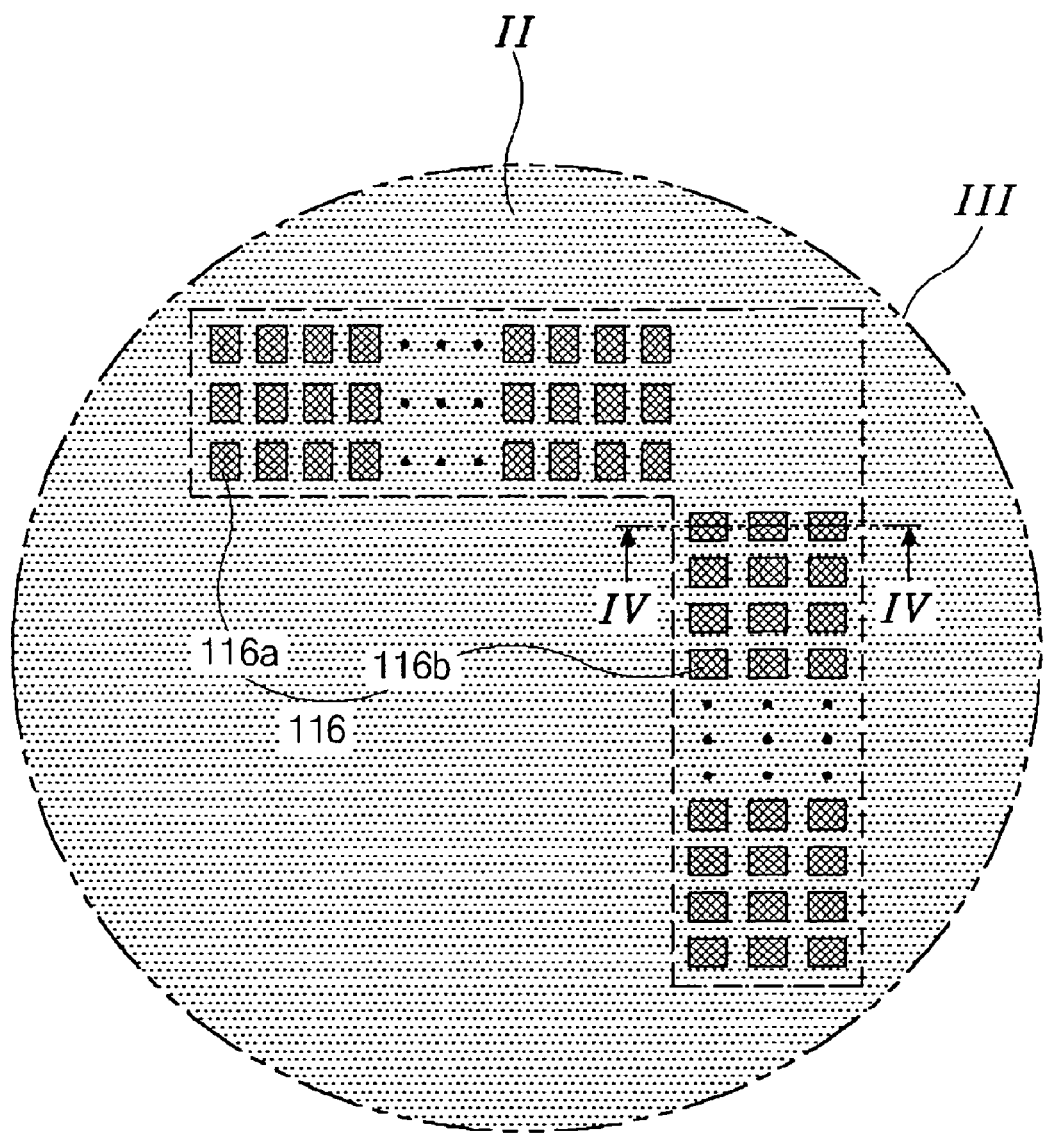
FIG. 4 is a magnified plane view of a portion "III" of FIG. 3.

FIG. 3 is a schematic plane view of a substrate used in a method of fabricating a semiconductor layer of polycrystalline silicon according to the first embodiment of the present invention and FIG. 4 is a magnified plane view of the portion "III" of FIG. 3.

In FIG. 3, a substrate 110 having a semiconductor layer (114 in FIG. 5) thereon includes a first region "I" and a second region "II" at the periphery of the first region "I." An align key 116 is formed at each corner portion in the second region "II" of the substrate 110. The first region "I" includes a plurality of pixel regions "P." The pixel region "P" is a unit region for displaying images, and includes a switching element portion 118 where the semiconductor layer of amorphous silicon is crystallized and a pixel portion 120 where the semiconductor layer of amorphous silicon is not crystallized. The pixel regions "P" can be pixel regions of a display device such as a liquid crystal display device, and the switching element portion 118 can be a thin film transistor. Moreover, the align keys 116 of the second region "II" are crystallized, but the semiconductor layer of amorphous silicon in other portions of the second region "II" is not crystallized.

The align keys 116 are used to crystallize the amorphous silicon in the switching element portion 118 with precision. In this regard, first the align keys 116 are crystallized. Then, the semiconductor layer of amorphous silicon in the switching element portion 118 of the first region "I" is crystallized by using the align keys 116. The align keys 116 may include polycrystalline silicon and the switching element portion 118 may include single crystalline silicon. In addition, the align keys 116 and the switching element portion 118 may be crystallized by using the same crystallization apparatus.

Even though the align keys 116 has a shape of "⊓" in the first embodiment, the align keys 116 may have various shapes in other embodiments.

In FIG. 4, the align key 116 having a shape of "⊓" in the second region "II" includes first and second align patterns 116a and 116b. The first align pattern 116a includes a plurality of first rectangularly shaped areas that are spaced apart from each other and disposed along a first direction. The second align pattern 116b includes a plurality of second rectangularly shaped areas that are spaced apart from each other and disposed along a second direction perpendicular to the first direction. As a result, the first and second align patterns 116a and 116b constitute a shape of "⊓" in total. The first and second align patterns 116a and 116b are made of polycrystalline silicon, while all other portions of the second region "II" are made of amorphous silicon. That is, the semiconductor layer having the first and second align patterns 116a and 116b is selectively crystallized so that the align keys 116 are formed with polycrystalline silicon. Other patterns, shapes and sizes may be adopted for the align key(s) 116. For example, a pattern for a photolithographic process may be used for the align key(s) 116.

Figure 5:
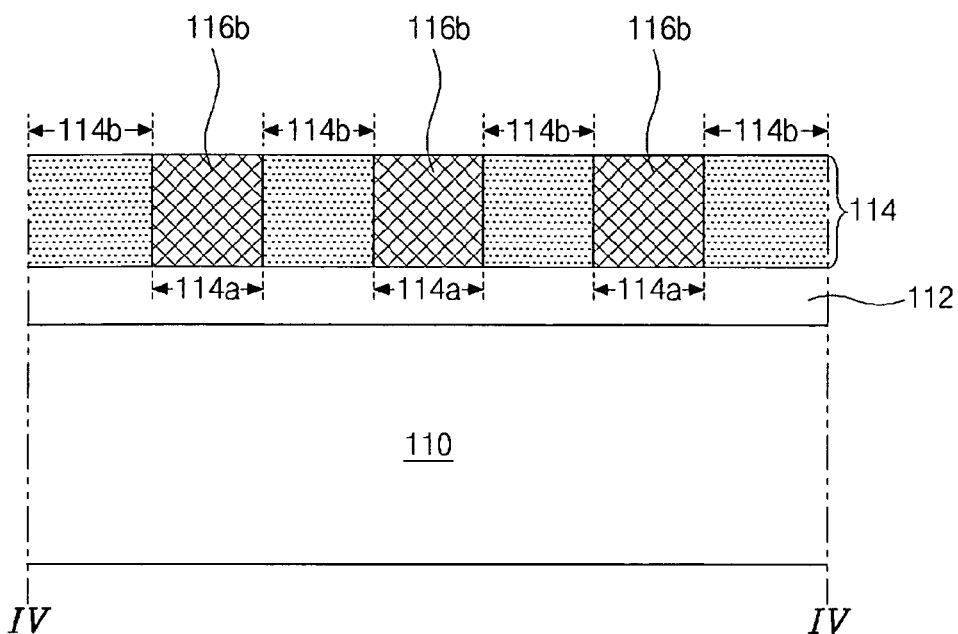
FIG. 5 is a schematic cross-sectional view taken along the line "IV—IV" of FIG. 4.

FIG. 5 is a schematic cross-sectional view of the align key 116, taken along the line "IV—IV" of FIG. 4. In FIG. 5, a buffer layer 112 is provided on the substrate 110 and the semiconductor layer 114 is formed on the buffer layer 112. The semiconductor layer 114 includes a polycrystalline silicon region 114a and an amorphous silicon region 114b, where the polycrystalline silicon region 114a here corresponds to the second align pattern 11 6b.

After crystallizing the semiconductor layer 114 in the switching element portion 118 (of FIG. 3) using the align keys 116 (of FIG. 4), a photolithographic process for the semiconductor layer 114 is performed. Generally, in an exposure apparatus for a photolithographic process, a mask is aligned to a substrate by using a step of an align key as a reference. However, in FIG. 3, since the align key 116 of the first embodiment does not have a step (i.e., it is not projected out from the substrate surface), an additional or separate align key for the photolithographic process is needed. In a second embodiment of the present invention, an align key which can be used in both the crystallization process and the photolithographic process is provided.

Figure 6:
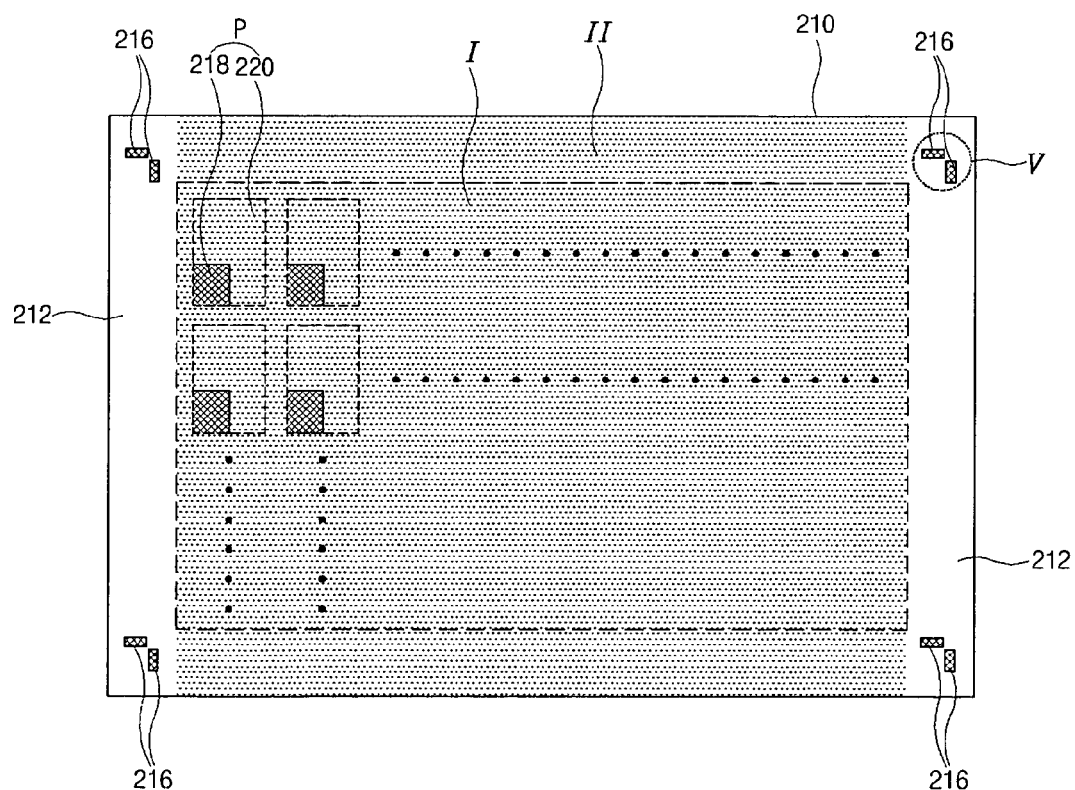
FIG. 6 is a schematic plane view of a substrate used in a method of fabricating a semiconductor layer of polycrystalline silicon according to a second embodiment of the present invention.

FIG. 6 is a schematic plane view of a substrate used in a method of fabricating a semiconductor layer of polycrystalline silicon according to the second embodiment of the present invention.

In FIG. 6, a substrate 210 having a semiconductor layer of amorphous silicon thereon includes a first region "I" and a second region "II" at the periphery of the first region "I." The first and second regions "I" and "II" of the substrate 210 may be referred to as a display region and a peripheral region, respectively. A buffer layer 212 may be formed between the substrate 210 and the semiconductor layer. The first region "I" includes a plurality of pixel regions "P." The pixel region "P" is a unit region for displaying images, and includes a switching element portion 218 where the semiconductor layer of amorphous silicon is crystallized and a pixel portion 220 where the semiconductor layer of amorphous silicon is not crystallized. An align key 216 is formed at each corner portion in the second region "II" of the substrate 210. Moreover, the align keys 216 of the second region "II" are crystallized, while the semiconductor layer of amorphous silicon at certain other portions in the second region "II" is removed such that the substrate 210 (if no buffer layer is present) or the buffer layer 212 is selectively exposed.

Figure 7:
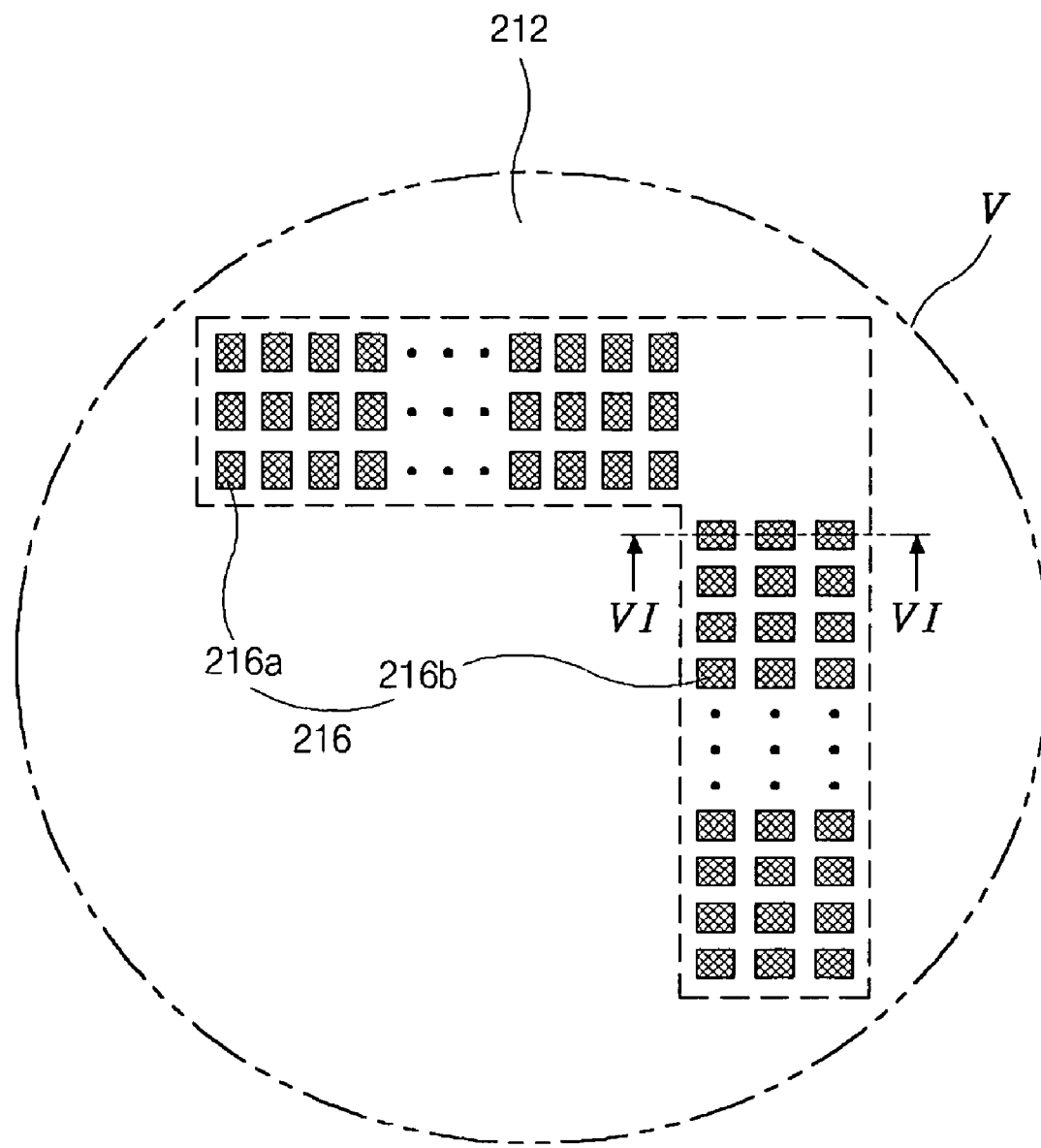
FIG. 7 is a magnified plane view of a portion "V" of FIG. 6.

FIG. 7 is a magnified plane view of the portion "V" of FIG. 6, showing the align key 216. In FIG. 7, the align key 216 having a shape of "⊓" includes first and second align patterns 216a and 216b. The first align pattern 216a includes first rectangularly shaped areas that are spaced apart from each other and disposed along a first direction. The second align pattern 216b includes second rectangularly shaped areas that are spaced apart from each other and disposed along a second direction perpendicular to the first direction. As a result, the first and second align patterns 216a and 216b constitute generally a shape of "⊐" in total. The first and second align patterns 216a and 216b are made of polycrystalline silicon, while certain other portions of the semiconductor layer 214 in the second region "II" are removed, thereby exposing portions of the buffer layer 212 or of the substrate 210 if no buffer layer is present. This exposure is shown in FIGS. 6 and 7 by removing the shading shown in FIGS. 3 and 4. Even though the align key 216 has a shape of "⊐" in the second embodiment, the align key may have various shapes in another embodiments.

Figure 8:
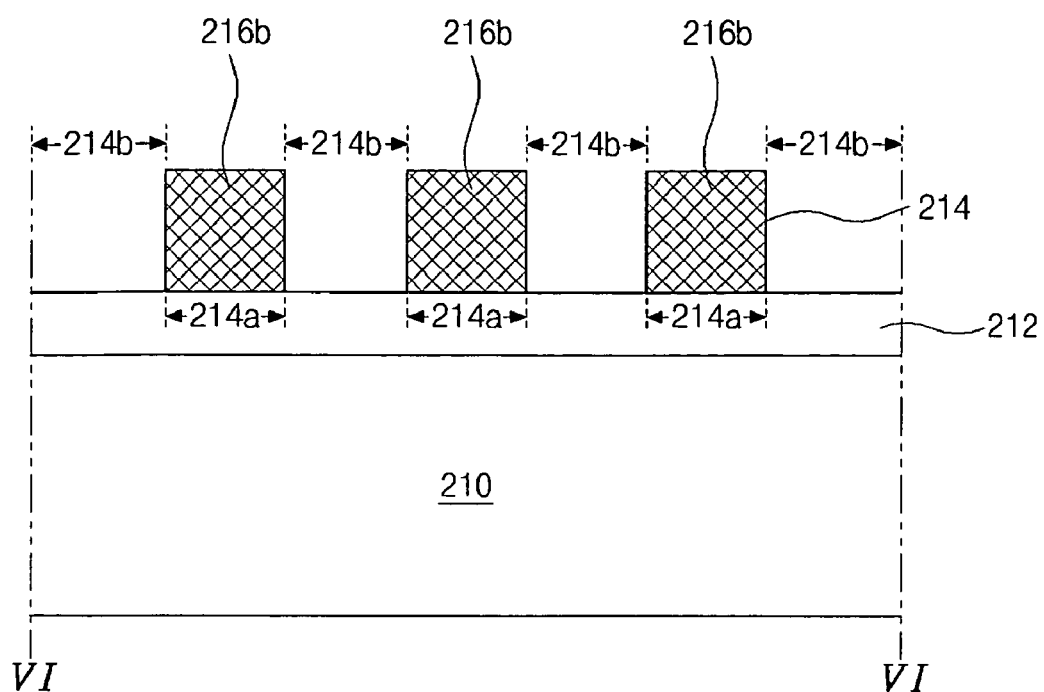
FIG. 8 is a schematic cross-sectional view taken along the line "VI—VI" of FIG. 7.

FIG. 8 is a schematic cross-sectional view of the align key 216, taken along the line "VI—VI" of FIG. 7. In FIG. 8, the buffer layer 212 is formed on the substrate 210 and a semiconductor layer 214 of amorphous silicon is initially formed on the buffer layer 212. Then by crystallizing selective portions of the semiconductor layer 214, the semiconductor layer 214 includes a polycrystalline silicon region 214a and an amorphous silicon region 214b. The polycrystalline silicon region 214a corresponds to the second align pattern 216b (in this example) and is made of polycrystalline silicon formed by the present crystallization process. The amorphous silicon region 214b corresponds to gaps in the second align pattern 216b and is formed by removing portions of the semiconductor layer 214. As a result, the align key 216 that is projecting from the surface of the buffer 212 and thus has steps with respect to the surrounding surfaces, is provided. Accordingly, the align key 216 can be used for both a crystallization process and a photolithographic process since the align key 216 now has a projected shape or convex shape including steps against the buffer layer 212.

The convex align keys or the steps of the align keys 216 may be obtained by dipping the substrate having the semiconductor layer into a secco etchant that has an etch selectivity of polycrystalline silicon to amorphous silicon as follows.

Figure 9A:
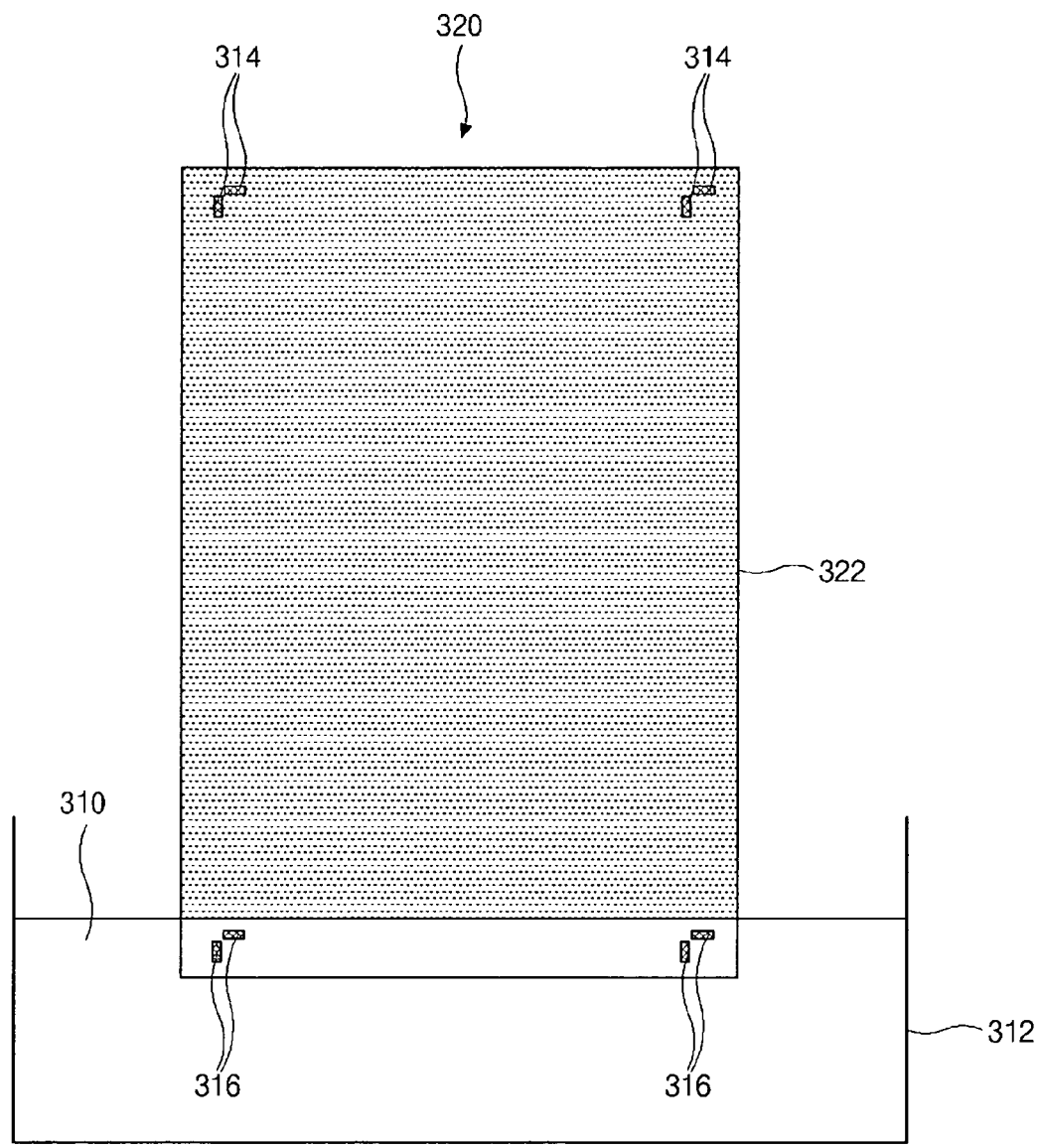
FIG. 9A is a schematic view showing a process of forming convex align keys according to an embodiment of the present invention.
Figure 9B:
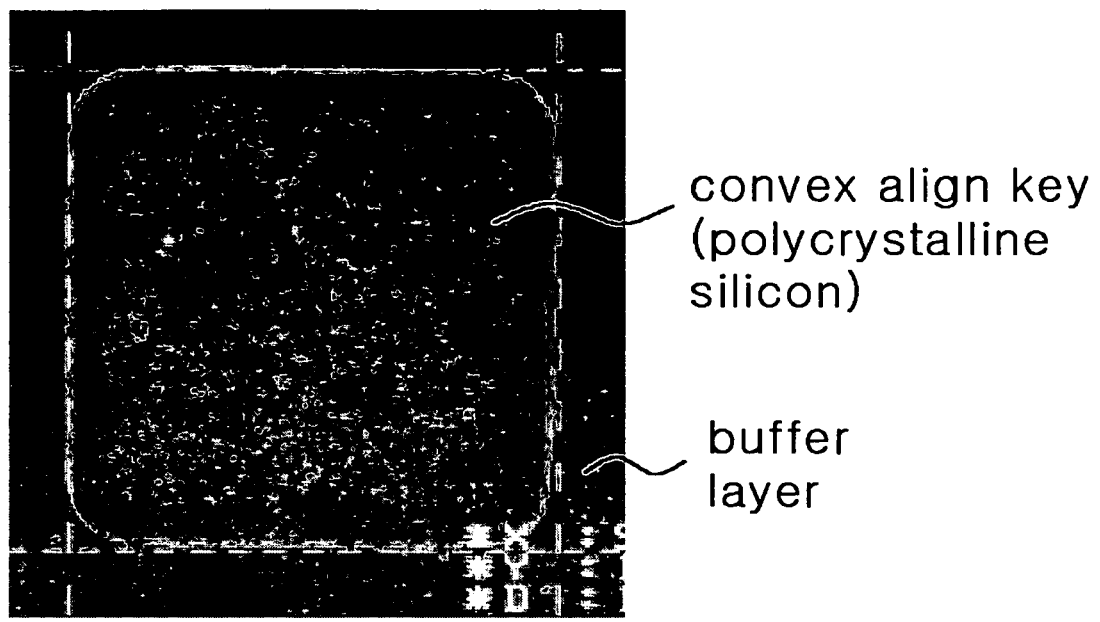
FIG. 9B is an example of a plane image of a convex align key of polycrystalline silicon formed by the process of FIG. 9A.

FIG. 9A is a schematic view showing the process of forming a convex align key according to an embodiment of the present invention and FIG. 9B is an example of a plane image of the convex align key formed by the process of FIG. 9A.

In FIG. 9A, after forming a semiconductor layer 322 of amorphous silicon on a substrate 320, flat align keys 314 are formed at corners of the substrate 320 by crystallizing the semiconductor layer. The flat align keys 314 can be the align keys 116 of FIG. 3 and can be formed in the same manner as the align keys 116. Other portions in the edge areas of the substrate 320 are not crystallized (i.e., they remain amorphous silicon). One side portion of the substrate 320 having the flat align keys 314 is dipped into a secco etchant 310 in a vessel 312. Amorphous silicon and polycrystalline silicon have different etch rates in the secco etchant. That is, the secco etchant has an etch selectivity of polycrystalline silicon to amorphous silicon. Accordingly, the dipped part of the semiconductor layer having amorphous silicon is removed whereas the flat align keys 314 of polycrystalline silicon remain, thereby forming convex align keys 316 having steps. Similarly, convex align keys in the other side portion of the substrate 320 may be obtained by dipping the other side portion of the substrate 320 that has the flat align keys 314 into the secco etchant 310. Since the convex align keys are obtained by patterning the semiconductor layer, the convex align keys may be referred to as align key patterns. The convex align keys (or the align key patterns) may have a slope against the substrate at a boundary portion thereof.

As an example, the secco etchant 310 includes hydrofluoric acid (HF) and potassium dichromate ($K_2Cr_2O_7$) where the ratio of HF:$K_2Cr_2O_7$ is about 2:1. The secco etchant may be adjusted to have a mole concentration of about 1.5M (mole/l).

After dipping the substrate 320 into the secco etchant 310, a cleaning process using hydrofluoric acid (HF) may be performed to remove oxidized materials from a surface of the semiconductor layer.

As shown in FIG. 9B, the convex align key of polycrystalline silicon remains while its surrounding area exposes the buffer layer. By the dipping process, the semiconductor layer of amorphous silicon surrounding the align keys is removed effectively, whereby the corresponding buffer layer on the substrate is exposed. The convex align keys then can be used as align keys for a photolithographic process because the convex align keys have steps against the buffer layer. As a result, additional or separate align keys for a photolithographic process are not needed according to the present invention.

Figure 10:
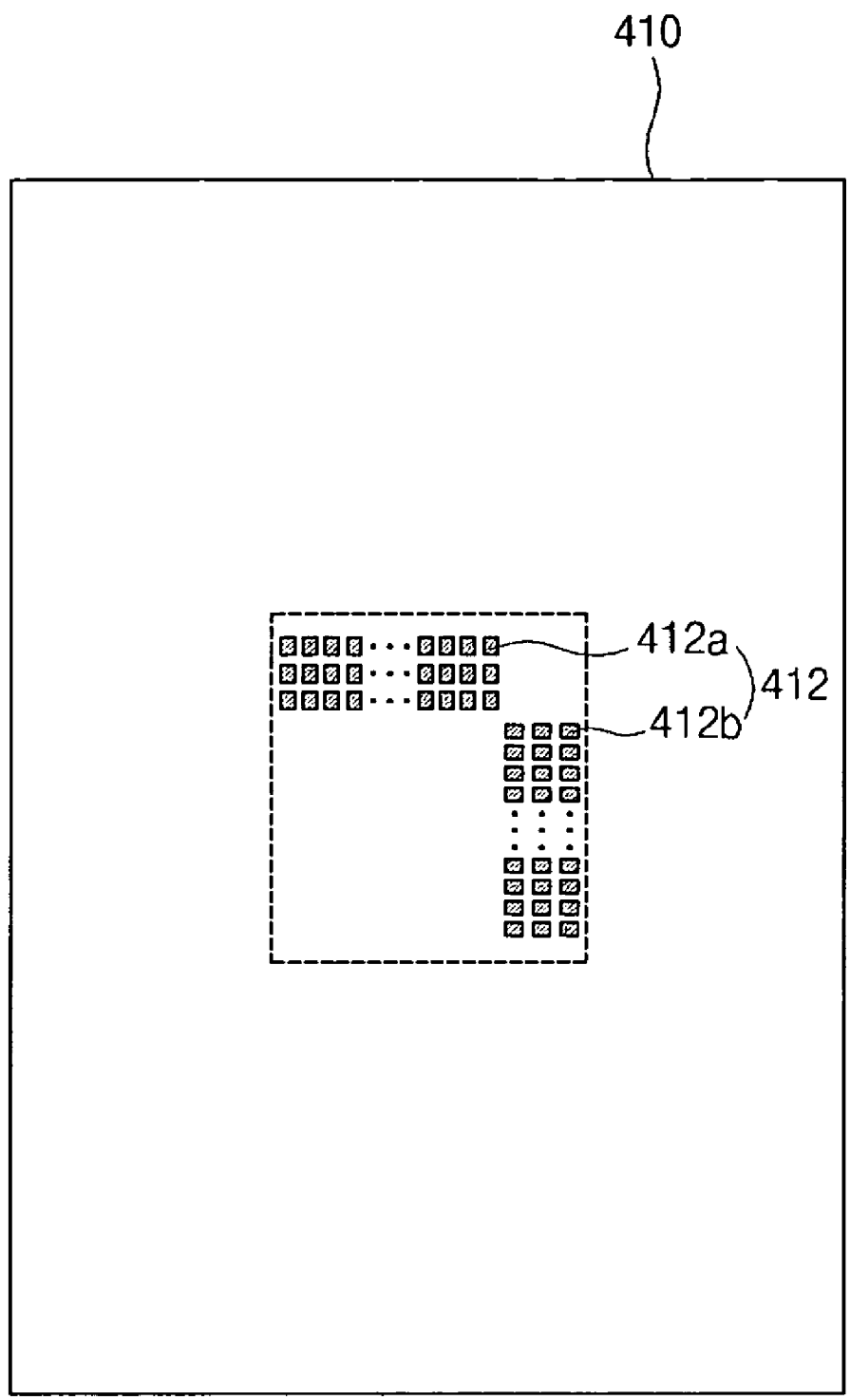
FIG. 10 is a schematic plane view of a mask for forming flat align keys according to an embodiment of the present invention.
Figure 11:
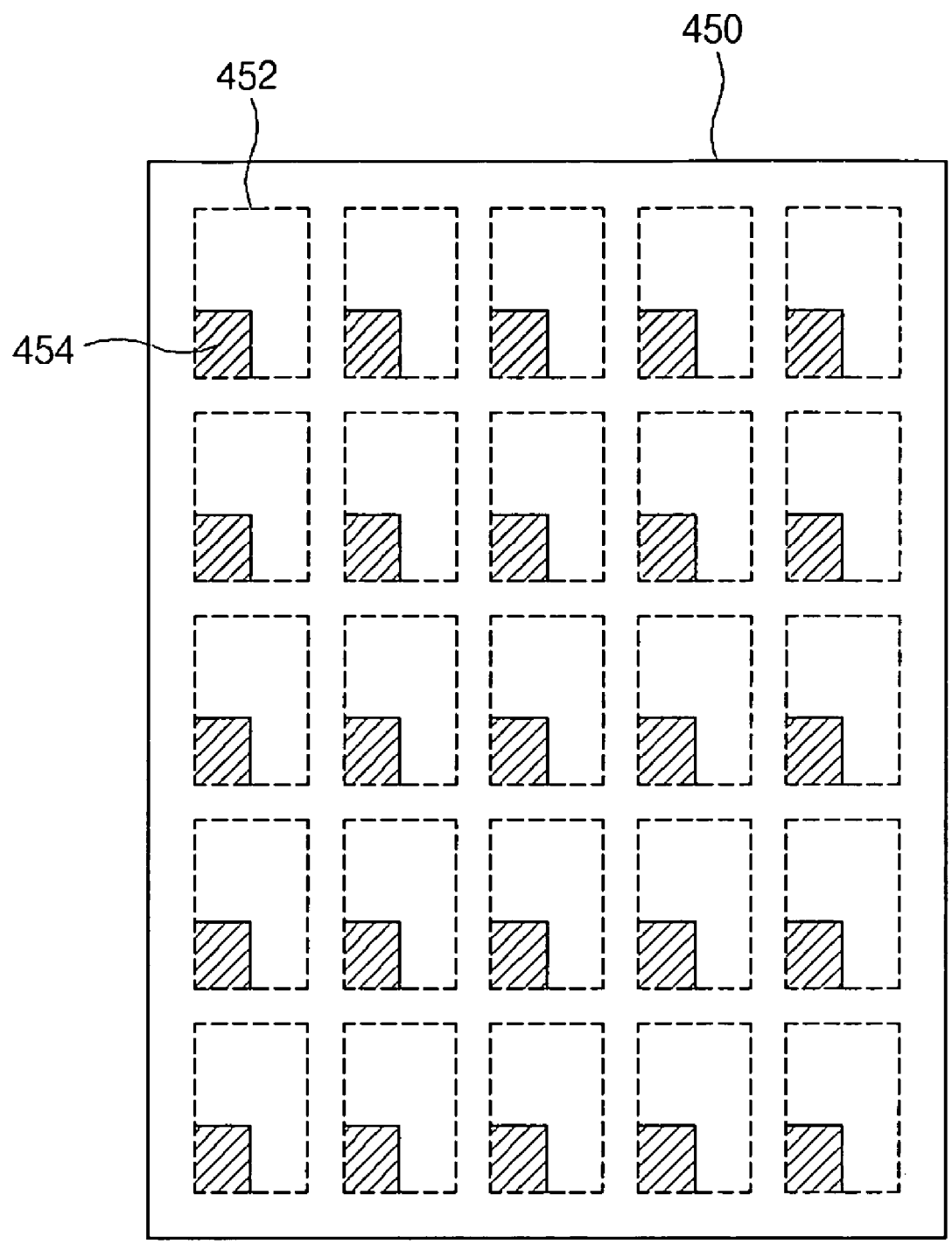
FIG. 11 is a schematic plane view of a mask for forming pixel regions according to an embodiment of the present invention.

FIG. 10 is a schematic plane view of a mask which can be used to form align keys according to an embodiment of the present invention and FIG. 11 is a schematic plane view of a mask which can be used to form pixel regions according to an embodiment of the present invention.

In FIG. 10, a mask 410 for forming align keys has a pattern 412 including a first transmissive portion 412a and a second transmissive portion 412b. The first transmissive portion 412a has rectangularly shaped areas that are spaced apart from each other and disposed along a first direction. The second transmissive portion 412b has rectangularly shaped areas that are spaced apart from each other and disposed along a second direction perpendicular to the first direction. The pattern 412 may be designed according to a magnification of a projection lens of a laser annealing apparatus. Even though the first and second transmissive portions 412a and 412b have rectangularly shaped areas in this embodiment, the first and second transmissive portions 412a and 412b may have square shaped areas in another embodiments.

As an example, to form align keys at four corners of a substrate, the mask 410 for forming the align keys (or the substrate) may be moved to a portion corresponding to one corner of the substrate and then a laser beam is irradiated onto the mask to form an align key. Then the same mask may be moved to another portion corresponding to another corner of the substrate and then the laser beam is irradiated onto the mask to form another align key. The align keys at four or other corners may be obtained by repeating this procedure involving the movement of the mask and the irradiation of the laser beam. Since the laser beam penetrates the first and second transmissive portions 412a and 412b of the mask 410, a semiconductor layer corresponding to the first and second transmissive portions 412a and 412b may be selectively crystallized by the laser beam irradiated thereon through the first and second transmission portions 412a and 412b of the mask 410.

The align keys may be formed using the same laser annealing apparatus that is used to crystallize a semiconductor layer in a pixel region. Even though not shown in FIG. 10, the shape and size of the align keys and of the pattern 412 in the mask may be changed to a different shape and size as desired.

FIG. 11 shows an example of a mask used to form pixel regions according to an embodiment of the present invention. In FIG. 11, a mask 450 for forming the pixel regions includes first regions 452 that are spaced apart from each other. Each first region 452 corresponds to a pixel region (not shown) of a substrate and includes a second region 454 having transmissive portions. Since a laser beam penetrates the transmissive portions of the mask 450, a semiconductor layer (not shown) corresponding to the transmissive portions of the mask 450 may be selectively crystallized by the laser beam. In addition, since other portions of the mask 450 shield the laser beam, the semiconductor layer corresponding to these other portions is not crystallized.

Figure 12A:
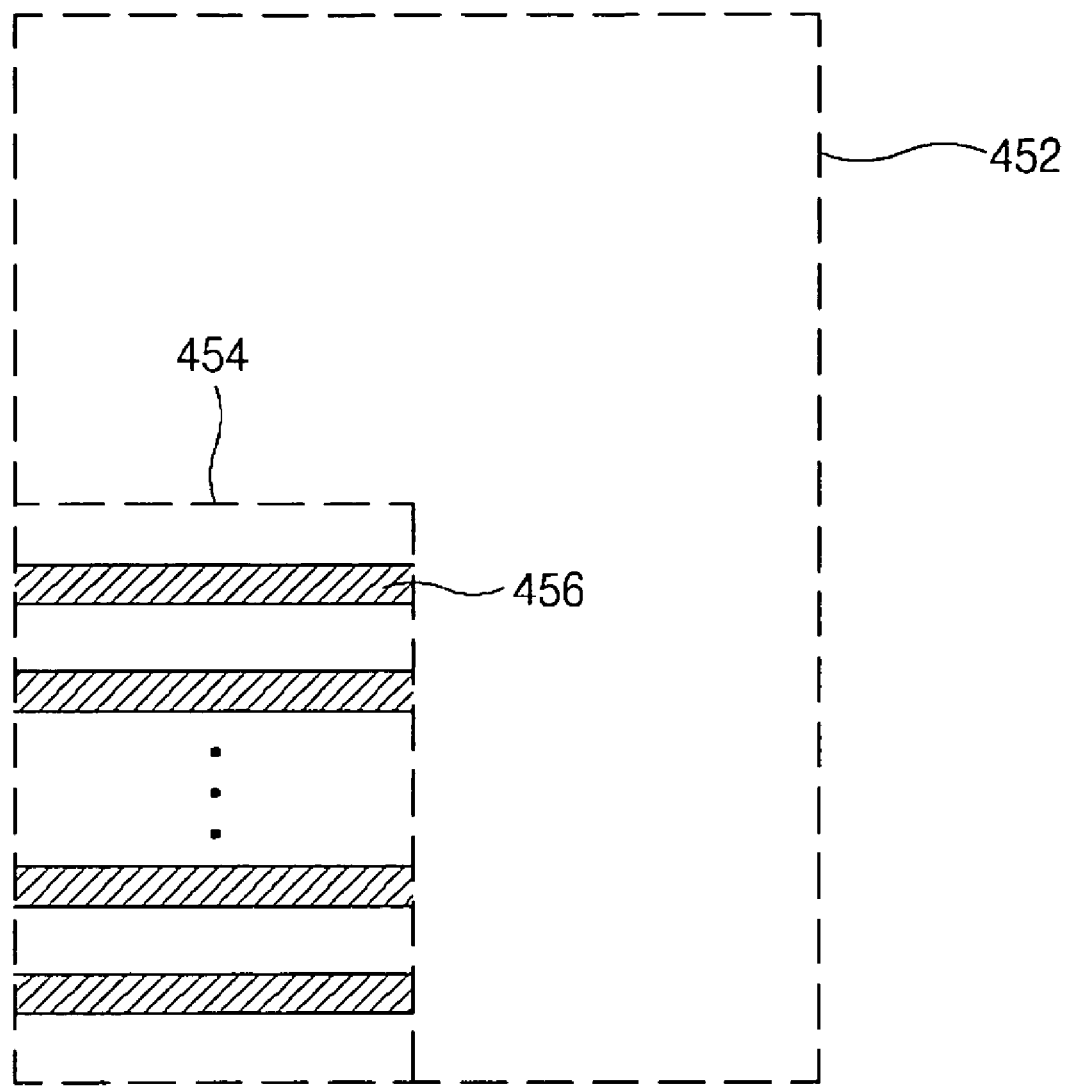
FIGS. 12A and 12B are magnified plane views showing two different examples of a first region 452 of FIG. 11.
Figure 12B:
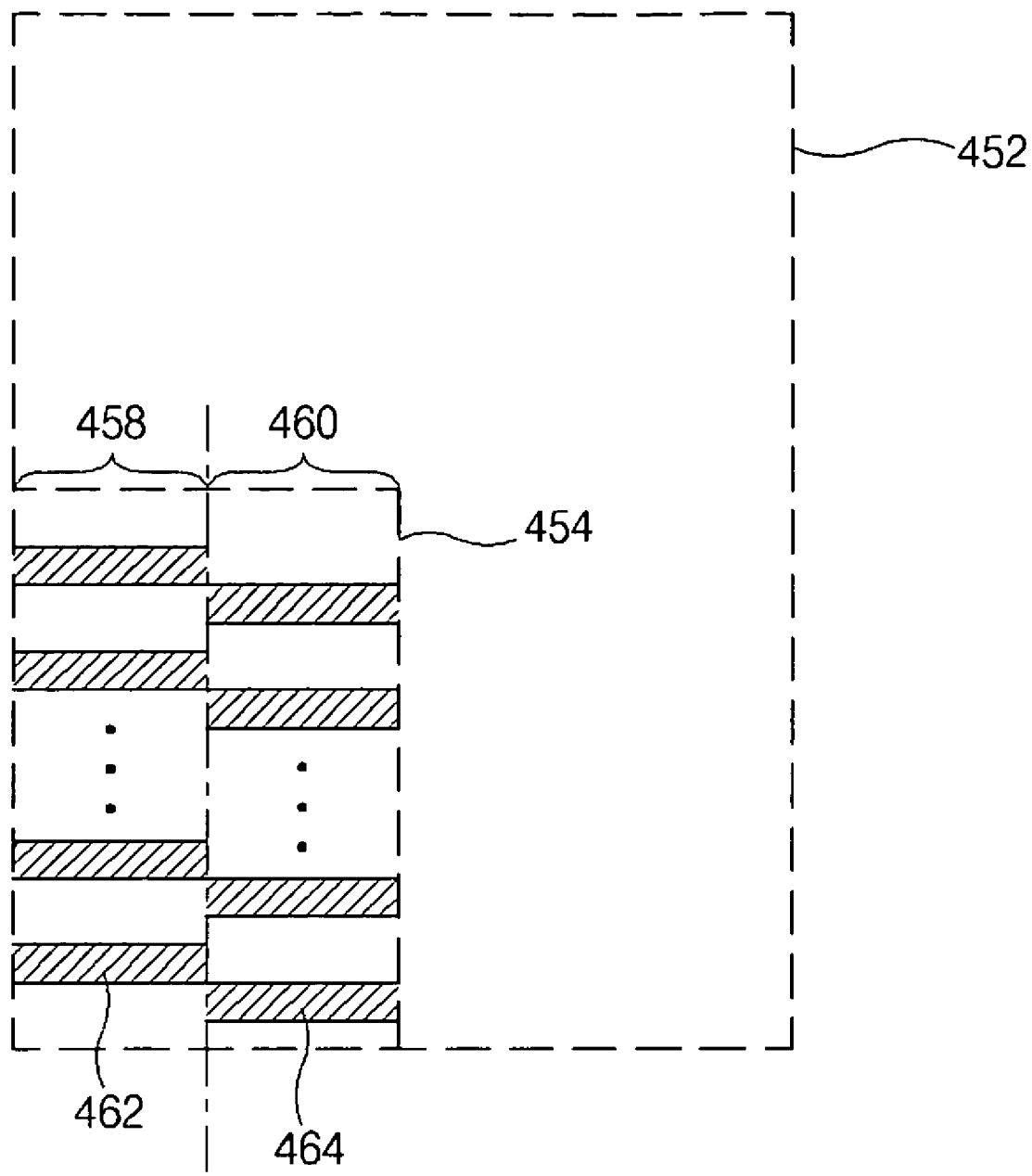

FIGS. 12A and 12B are magnified plane views showing two different examples of a first region 452 of FIG. 11. In FIG. 12A, each first region 452 of the mask for forming the pixel regions includes a second region 454 having slits 456 in one block. The slits 456 are spaced apart from each other and disposed along one direction. When such a mask for forming the pixel regions having the slits 456 in one block is used for crystallization of a semiconductor layer in the pixel regions, a laser beam may be irradiated onto the semiconductor layer along multiple directions, for example, two perpendicular directions. This laser annealing method may be referred to as a multiple scan method. Other portions of the second region 454 in the first region 452 shield the laser beam.

In another example as shown in FIG. 12B, each first region 452 of the mask for forming the pixel regions includes a second region 454 having first slits 462 in a first block 458 and second slits 464 in a second block 460. The first slits 462 are spaced apart from each other and the second slits 464 are spaced apart from each other. The first slits 462 are alternately disposed with the second slits 464. When such a mask for forming the pixel regions having the first and second slits 462 and 464 in two blocks is used for crystallization of a semiconductor layer in the pixel regions, a laser beam may be irradiated onto the semiconductor layer along one direction, and this laser annealing method may be referred to as a single scan method. In the single scan method, the throughput of the crystallization process may be improved because the effects of two directional scan can now be obtained by one directional scan. Other portions of the second region 454 in the first region 452 shield the laser beam.

Figure 13A:
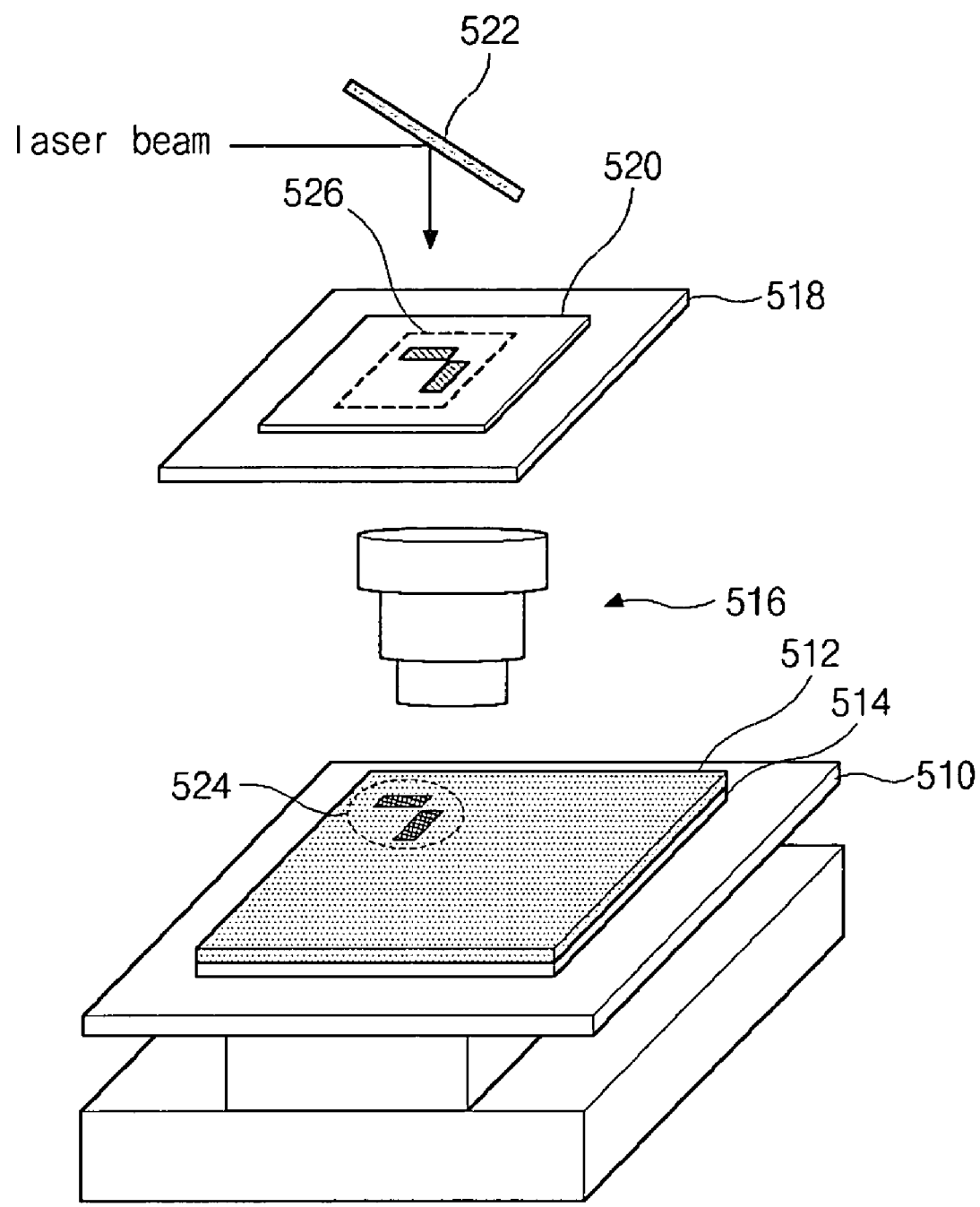
FIGS. 13A to 13C are schematic views showing an apparatus for and a method of fabricating polycrystalline silicon according to the present invention.
Figure 13B:
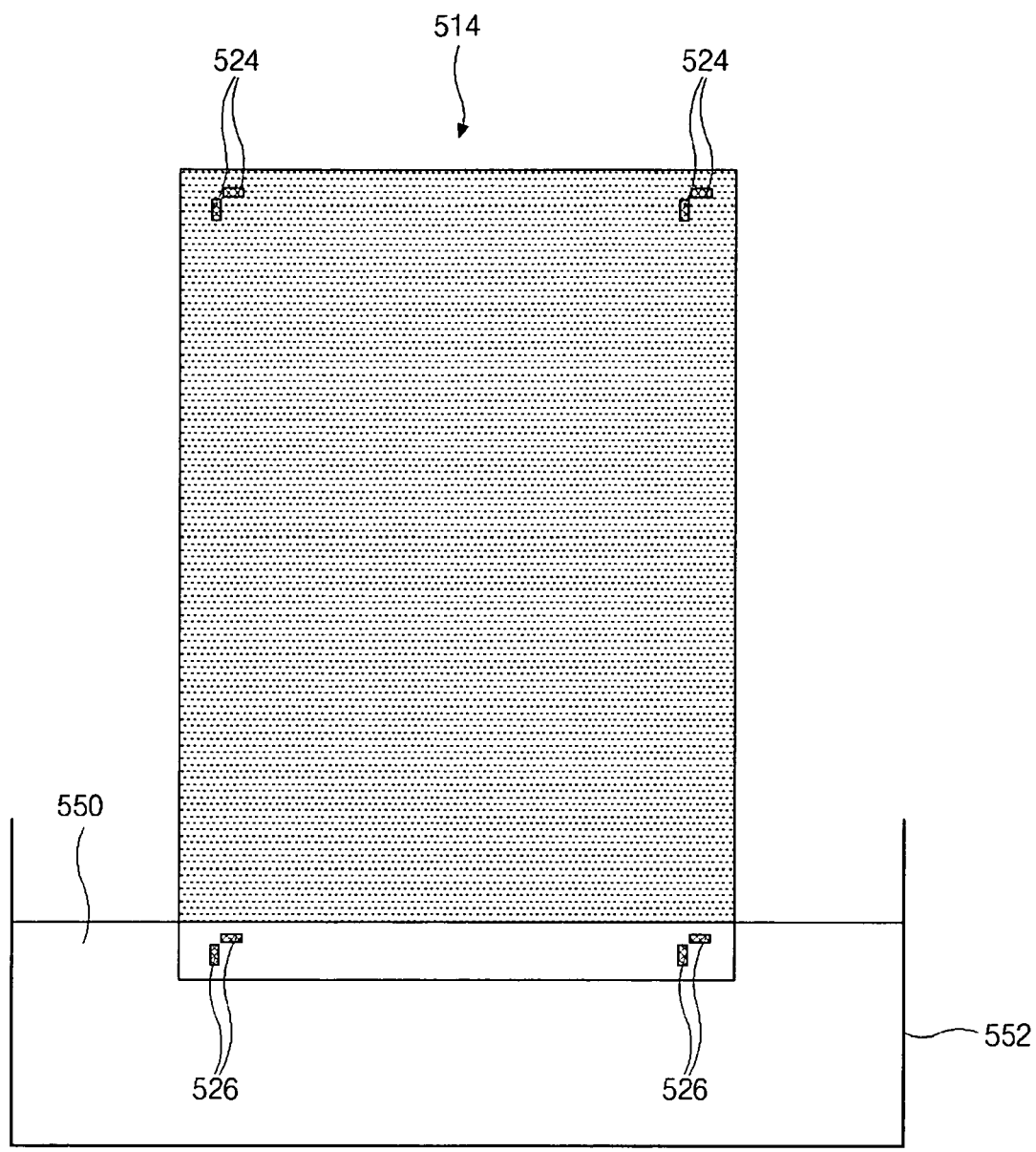
Figure 13C:
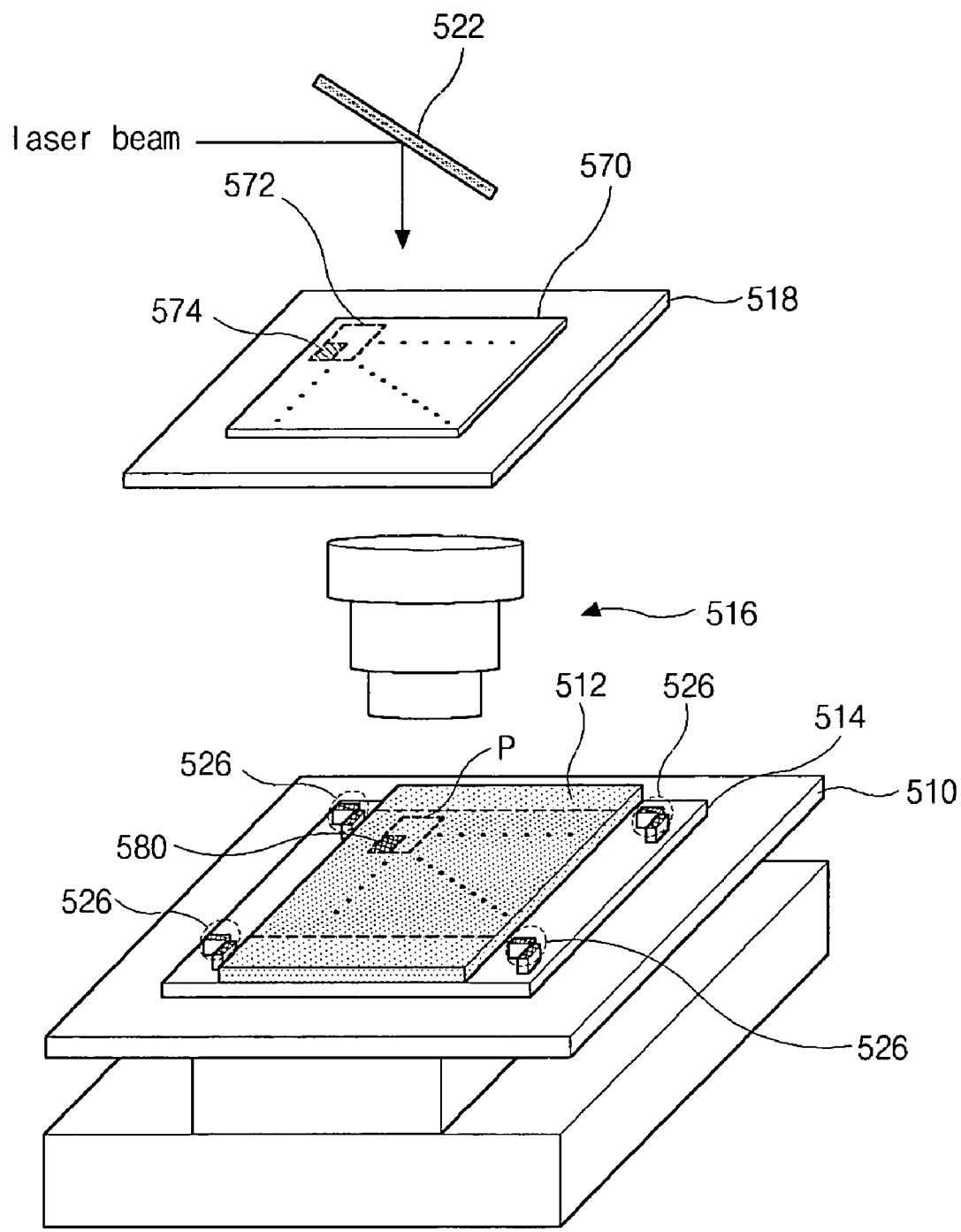

FIGS. 13A to 13C are schematic views showing an apparatus for and a method of fabricating polycrystalline silicon according to an embodiment of the present invention.

In FIG. 13A, initially, a substrate 514 having a semiconductor layer 512 of amorphous silicon thereon is disposed on a moving stage 510. Although a buffer layer is not shown, it can be provided between the substrate 514 and the semiconductor layer as shown in FIG. 5. A projection lens 516 focusing a laser beam with a specific magnification is disposed over the semiconductor layer 512 and a mask stage 518 is disposed over the projection lens 516. A mask 520 for forming align keys is disposed on the mask stage 518 and a mirror 522 for changing a direction of the laser beam is disposed over the mask 520. The mask 520 may have the pattern 412 (of FIG. 10) and may be disposed to correspond to a first corner of the substrate 514. A first flat align key 524 at the first corner of the substrate 514 may be obtained by irradiating the laser beam through the mask 520. The other three flat align keys at other three corner portions of the substrate 514 may be obtained by repeating the movement of the moving stage 510 and the irradiation of the laser beam.

As a result, four flat align keys 524 of polycrystalline silicon may be obtained by crystallizing portions of the semiconductor layer 512 of amorphous silicon using the apparatus of FIG. 13A. The flat align keys 524 do not have steps against the substrate 514 at their boundaries because the thickness of the semiconductor layer 512 surrounding the flat align keys 524 is the same as or similar to that of the flat align keys 524.

Then, in FIG. 13B, into a secco etchant 550 in a vessel 552, one side portion of the substrate 514 having the flat align keys 524 of polycrystalline silicon is dipped. Amorphous silicon and polycrystalline silicon have different etch rates in the secco etchant 550. That is, the secco etchant 550 has an etch selectivity of polycrystalline silicon to amorphous silicon. Accordingly, the semiconductor layer 512 (FIG. 13A) of amorphous silicon is removed selectively to transform the flat align keys 524 of polycrystalline silicon into convex align keys 526 having steps, by dipping one side portion of the substrate 514 into the secco etchant 550. Similarly, convex align keys in the other side portion of the substrate 514 may be obtained by dipping the other side portion of the substrate 514 into the secco etchant 550. This procedure is discussed also in connection with FIG. 9A.

As an example only, the secco etchant 550 includes hydrofluoric acid (HF) and potassium dichromate ($K_2Cr_2O_7$) where the ratio of HF:$K_2Cr_2O_7$ is about 2:1. The secco etchant 550 may be adjusted to have a mole concentration of about 1.5M (mole/l).

After dipping the substrate 514 into the secco etchant 550, a cleaning process using hydrofluoric acid (HF) may be performed to remove oxidized materials from a surface of the semiconductor layer 512.

Then, in FIG. 13C, the substrate 514 having the convex align keys 526 is disposed on the moving stage 510 and the mask stage 518 is disposed over the substrate 514. A mask 570 for forming pixel regions is disposed on the mask stage 518. The mask 570 has a plurality of first regions 572 spaced apart from each other. Each first region 572 includes a second region 574 and the second region 574 may have slits (not shown in FIG. 13C). The mirror 522 is disposed over the mask 570 to change the path of the laser beam.

The mask 570 is aligned to the pixel regions "P" of the semiconductor layer 512 using the convex align key(s) 526 and the laser beam is irradiated onto the semiconductor layer 512 in the pixel regions "P" to crystallize the semiconductor layer 512 in the pixel regions "P" selectively. That is, the position of grain boundaries of the semiconductor layer 512 of polycrystalline may be controlled and may be determined by using the convex align keys 526 as a reference. Each first region 572 of the mask 570 corresponds to a pixel region "P" in the semiconductor layer 512, and each second region 574 of the mask 570 corresponds to a switching element region 580 in the corresponding pixel region "P" of the semiconductor layer 512.

As an example, the semiconductor layer 512 in the switching element regions 580 may be crystallized through a sequential lateral solidification (SLS) method. Moreover, since the laser annealing condition for the semiconductor layer 512 in the switching element regions 580 is different from that for the convex align keys 526, the crystallinity of the semiconductor layer 512 in the switching element regions 580 is also different from that of the convex align keys 526. For instance, the crystallinity of the semiconductor layer 512 in the switching element regions 580 may be better than that of the convex align keys 526.

Since the semiconductor layer 512 is selectively crystallized using the convex align keys 526, uniformity of crystallization is achieved and the position of grain boundaries is controlled with precision. Moreover, since the convex align keys 526 have steps against the substrate 514 (or buffer layer if present), the convex align keys 526 can be recognized and used in a subsequent photolithographic process. Accordingly, additional or separate align keys for the photolithographic process are not needed, and the entire fabrication process for forming the switching elements such as thin film transistors in a display device such as a liquid crystal display device is simplified. In addition, the position of the active layer of a switching element may be determined by using the convex align key(s) 526 as a reference.

Figure 14:
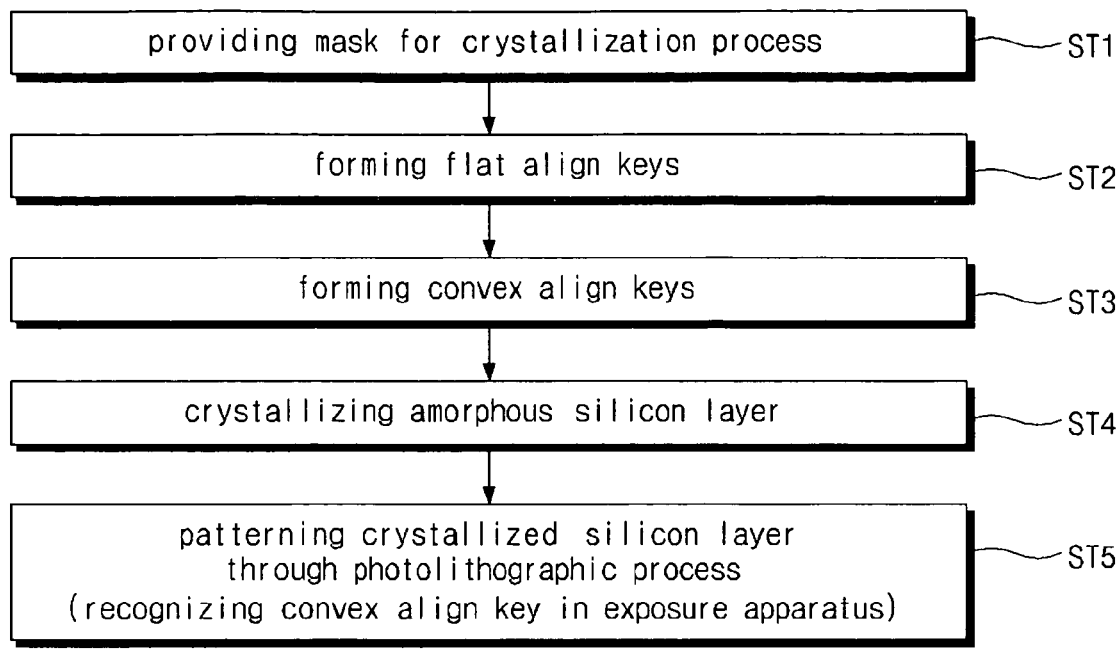
FIG. 14 is a flow chart illustrating the method of fabricating polycrystalline silicon of FIGS. 13A to 13C.

FIG. 14 is a flow chart illustrating the method of fabricating polycrystalline silicon according to an embodiment of the present invention. The steps of this method can be implemented in the apparatus of FIGS. 13A–13C using the masks shown in FIGS. 10–12B as discussed above.

Referring to FIG. 14, at ST1, masks for crystallization are provided. The masks for crystallization include a mask for forming align keys and a mask for forming pixel regions by crystallizing a semiconductor layer of amorphous silicon as discussed above. In addition, the masks for crystallization may include a mask for forming a driving region. For example, a mask having patterns resulting in high crystallinity and low throughput may be used as the mask for forming a driving region of a display device. Moreover, the mask for forming align keys may have a pattern including first and second transmissive portions having rectangularly shaped areas. The first and second transmissive portions together may form generally an "T"-shaped configuration, but the invention is not limited to this configuration. The mask for forming pixel regions may have one or more transmissive portions that correspond to a switching element region of a semiconductor layer.

At ST2, flat align keys of polycrystalline silicon are formed at corners of a substrate by irradiating a laser beam onto a semiconductor layer of amorphous silicon on the substrate through the mask for forming align keys, as discussed above. The flat align keys may be obtained by crystallizing the semiconductor layer of amorphous silicon and may have a shape corresponding to a pattern of the mask for forming align keys.

At ST3, convex align keys are formed by dipping the semiconductor layer having the flat align keys into a secco etchant or other suitable etchant. The secco etchant has an etch selectivity of polycrystalline silicon to amorphous silicon. Accordingly, the flat align keys of polycrystalline silicon remain while some other portions of amorphous silicon in the semiconductor layer are removed, thereby forming convex align keys having steps against the substrate or buffer layer. Since the convex align keys are obtained by patterning the semiconductor layer, the convex align keys may be referred to as align key patterns. The convex align keys (or the align key patterns) may have a slope against the substrate at a boundary portion thereof. As an example, the convex align keys may be formed at four corners of the substrate by subsequently or simultaneously dipping both sides of the substrate into the secco etchant. The substrate here forms only one liquid crystal panel, but the present invention covers a substrate having a plurality of liquid crystal display panel outlines for forming multiple display panels. The convex align keys may be formed at four corners of the substrate even when the substrate forms multiple liquid crystal display panels.

As an example, the secco etchant used in the method of FIG. 14 may include hydrofluoric acid (HF) and potassium dichromate ($K_2Cr_2O_7$) where the ratio of HF:$K_2Cr_2O_7$ is about 2:1. The secco etchant may be adjusted to have a mole concentration of about 1.5M (mole/l).

In addition, after dipping the substrate into the secco etchant, a cleaning process using hydrofluoric acid (HF) may be performed to remove oxidized materials from a surface of the semiconductor layer.

At ST4, the mask for pixel regions is aligned to the semiconductor layer using the convex align keys such that the transmissive portions of the mask for pixel regions corresponds to a switching element region and a laser beam is irradiated onto the semiconductor layer in the switching element region through this mask. Since the switching element region is selectively crystallized, crystallinity of the semiconductor layer is improved significantly. Moreover, since the semiconductor layer is crystallized using the convex align keys as a reference, the position of the grain boundary is controlled with ease and the crystallization of the semiconductor layer in an open region corresponding to a pixel electrode is prevented. Accordingly, defects in the buffer layer or the substrate due to the crystallization of the semiconductor layer are prevented, and a stain of display images resulting from these defects is prevented.

The semiconductor layer in the switching element region may be crystallized through a sequential lateral solidification (SLS) method where the laser beam has an energy density corresponding to a completely melting regime of silicon. In addition, a mask for forming a driving region may be aligned to correspond to a driving region surrounding the pixel regions using the convex align keys. The semiconductor layer in the driving region may be crystallized by irradiating a laser beam through this mask. Since the semiconductor layer in the driving region is crystallized using the convex align keys as a reference, the position of the grain boundary is controlled with ease. As a result, the properties of switching elements in a driving circuit and the driving circuit are improved greatly.

At ST5, the semiconductor layer having the polycrystalline silicon as discussed above is then patterned to be a semiconductor layer (active layer) for a switching element through a photolithographic process using the same convex align keys as photo align keys. The photolithographic process includes forming a photoresist (PR) layer on the semiconductor layer, forming a PR pattern though exposure and development of the PR layer, and patterning the semiconductor layer on the substrate using the PR pattern as an etch mask. In a step of exposure, a mask for patterning the semiconductor layer is aligned using the convex align keys. Accordingly, an additional or separate align key for patterning the semiconductor layer to form the active layer of a switching element is not needed and the entire process of fabricating switch elements and a liquid crystal display device is simplified.

Figure 15:
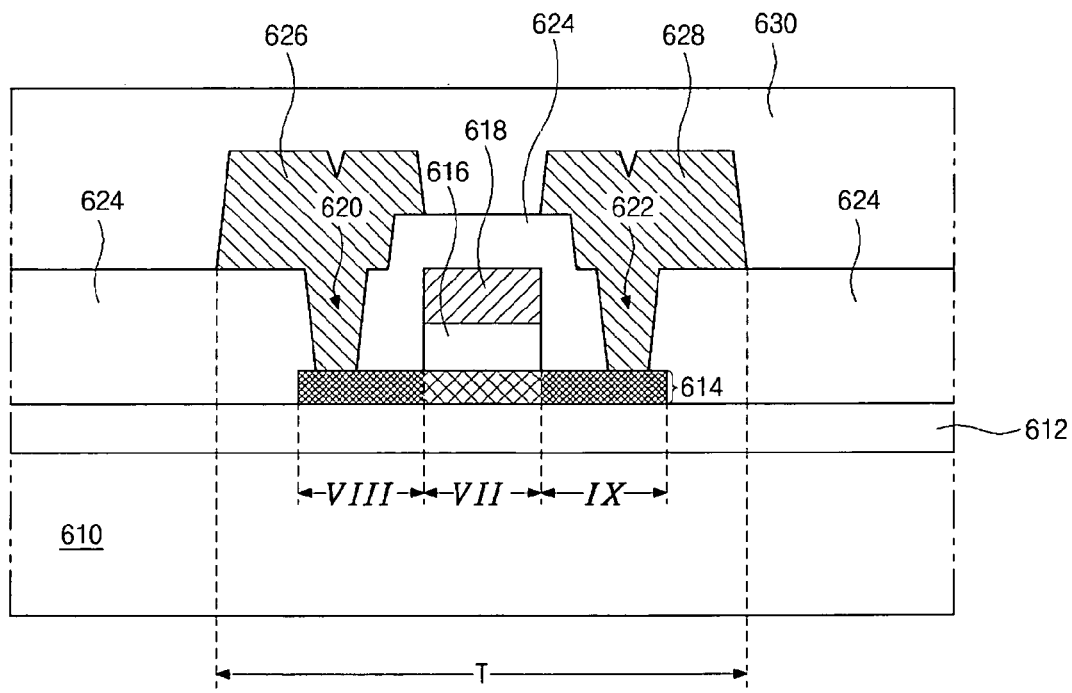
FIG. 15 is a schematic cross-sectional view showing a switching element of polycrystalline silicon according to an embodiment of the present invention.

FIG. 15 is a schematic cross-sectional view showing a switching element having the polycrystalline silicon of the present invention according to an embodiment of the present invention.

In FIG. 15, a buffer layer 612 is formed on a substrate 610 and a semiconductor layer (active layer) 614 of polycrystalline silicon is formed on the buffer layer 612. The semiconductor layer 614 of polycrystalline silicon can be formed using the crystallization and pattern methods discussed above, and includes a channel region "VII" and source and drain regions "VIII" and "IX" at both sides of the channel region "VII." A gate insulating layer 616 is formed on the semiconductor layer 614 in the channel region "VII" and a gate electrode 618 is formed on the gate insulating layer 616.

An interlayer insulating layer 624 is formed on the gate electrode 618 and on the buffer layer 612. The interlayer insulating layer 624 includes first and second contact holes 620 and 622. The first and second contact holes 620 and 622 expose the semiconductor layer 614 in the source and drain regions "VIII" and "IX," respectively. Source and drain electrodes 626 and 628 are formed on the interlayer insulating layer 624. The source electrode 626 is electrically connected to the semiconductor layer 614 in the source region "VIII" through the first contact hole 620 and the drain electrode 628 is electrically connected to the semiconductor layer 614 in the drain region "IX" through the second contact hole 622. A passivation layer 630 is formed on the source and drain electrodes 626 and 628. The semiconductor layer 614 in the source and drain regions "VIII" and "IX" is doped with impurities of n(negative)-type or p(positive)-type.

As mentioned above, the semiconductor layer 614 may be formed using the crystallization process discussed above according to the various embodiments of the present invention. For example, single crystalline silicon may be used for the semiconductor layer 614 through a sequential lateral solidification (SLS) method. The semiconductor layer 614, the gate electrode 618, the source electrode 626 and the drain electrode 628 constitute a switching element "T" such as a thin film transistor TFT.

In the present invention, since a semiconductor layer is selectively crystallized using convex align keys, uniformity in the crystallization properties is improved and the position of the grain boundaries is controlled easily with precision. As a result, the driving property of a driving circuit is improved due to the easy position controllability of the grain boundaries of a semiconductor layer and the display quality of a display device using the semiconductor layer is improved due to the selective crystallization. Moreover, since convex align keys have steps against the substrate or buffer layer, the same convex align keys can be used for both the crystallization process and a photolithographic process of a semiconductor layer, especially, for an exposure apparatus. Accordingly, additional or separate align keys for the photolithographic process are not needed and the entire process of forming a switching element such as a TFT is simplified.

The present method of forming pixel regions, switching elements and driving regions is used to from a liquid crystal display panel/device or other suitable devices.

While the invention has been particularly shown and described with reference to an illustrated embodiment thereof, it will be understood by those skilled in the art that the foregoing and other changes in form and details may be made therein without departing from the spirit and scope of the invention.

What is claimed is:

1. A switching device comprising:
   a substrate including a first region and a second region surrounding the first region;
   a plurality of align key patterns of polycrystalline silicon on the substrate in the second region to form a plurality of convex align keys, the plurality of convex align keys having slope against the substrate;
   an active layer of polycrystalline silicon on the substrate in the first region, the active layer including a channel region and source and drain regions at sides of the channel region;
   a gate insulating layer on the active layer;
   a gate electrode on the gate insulating layer;
   an interlayer insulating layer on the gate electrode, the interlayer insulating layer including a first contact hole exposing the source region and a second contact hole exposing the drain region; and
   source and drain electrodes on the interlayer insulating layer, the source electrode being connected to the source region through the first contact hole and the drain electrode being connected to the drain region through the second contact hole.

2. The switching device of claim 1, wherein a crystallinity of the active layer is different from that of the plurality of align key patterns.

3. The switching device of claim 1, wherein a position of the active layer is determined by using the plurality of align key patterns as a reference.

4. The switching device of claim 1, further comprising a buffer layer between the substrate and the active layer.

5. The switching device of claim 1, further comprising:
   a passivation layer on the source and drain electrodes.

6. The switching device of claim 1, wherein the source and drain regions are doped with one of n(negative)-type impurities and p(positive)-type impurities.

7. The switching device of claim 1, wherein the active layer, the gate electrode, the source electrode and the drain electrode constitute a thin film transistor.

8. A display device structure comprising:
   a substrate having a display region and a periphery region;
   a plurality of align keys at corners in the periphery region, wherein the plurality of align keys are flush with surrounding surfaces of the substrate;
   a plurality of pixel regions in the display region; and
   a plurality of switching element regions each in one of the pixel regions.

9. The structure of claim 8, wherein the plurality of align keys are made of polycrystalline silicon.

10. The structure of claim 8, wherein the plurality of align keys have a pattern which corresponds to a pattern of a mask used to crystallize the align keys.

11. The structure of claim 8, wherein each of the plurality of align keys is made up of a plurality of key units uniformly spaced apart.

12. The structure of claim 8, wherein the display region is a pixel area of a liquid crystal display panel.

13. A display device structure comprising:
   a substrate having a display region and a periphery region;
   a plurality of align keys in the periphery region, wherein the plurality of align keys are made of amorphous silicon that has been crystallized;
   a plurality of pixel regions in the display region; and
   a plurality of switching element regions each in one of the pixel regions.

14. The structure of claim 13, wherein the plurality of align keys are projected from surrounding surfaces of the substrate.

15. The structure of claim 13, wherein each of the plurality of align keys is made up of a plurality of key units uniformly spaced apart.

16. The structure of claim 13, wherein the plurality of align keys have a pattern which corresponds to a pattern of a mask used to crystallize the amorphous silicon.

17. The structure of claim 13, wherein the display region is a pixel area of a liquid crystal display panel.

18. The structure of claim 13, wherein the plurality of align keys are flush with surrounding surfaces of the substrate.

19. A switching device comprising:
a substrate including a first region and a second region surrounding the first region;
a plurality of align keys made of polycrystalline silicon on the substrate in the second region, the plurality of align keys being flush with surrounding surfaces of the substrate;
an active layer of polycrystalline silicon on the substrate in the first region, the active layer including a channel region and source and drain regions at sides of the channel region;
gate insulating layer on the active layer;
a gate electrode on the gate insulating layer;
an interlayer insulating layer on the gate electrode, the interlayer insulating layer including a first contact hole exposing the source region and a second contact hole exposing the drain region; and
source and drain electrodes on the interlayer insulating layer, the source electrode being connected to the source region through the first contact hole and the drain electrode being connected to the drain region through the second contact hole.

20. The switching device of claim 19, wherein a crystallinity of the active layer is different from that of the plurality of align keys.

21. The switching device of claim 19, wherein a position of the active layer is determined by using the plurality of align keys as a reference.

22. The switching device of claim 19, farther comprising:
a buffer layer between the substrate and the active layer.

23. The switching device of claim 19, further comprising:
a passivation layer on the source and drain electrodes.

24. The switching device of claim 19, wherein the source and drain regions are doped with one of n(negative)-type impurities and p(positive)-type impurities.

25. The switching device of claim 19, wherein the switching device is part of a liquid crystal display device.

* * * * *